(12) United States Patent
Moschopoulos et al.

(10) Patent No.: US 9,606,913 B2
(45) Date of Patent: Mar. 28, 2017

(54) ELECTRONIC CIRCUIT FOR AND METHOD OF EXECUTING AN APPLICATION PROGRAM STORED IN A ONE-TIME-PROGRAMMABLE (OTP) MEMORY IN A SYSTEM ON CHIP (SOC)

(71) Applicant: Dialog Semiconductor B.V., 's-Hertogenbosch (NL)

(72) Inventors: Nikolaos Moschopoulos, Athens (GR); Jakobus Johannes Verhallen, Oss (NL); Konstantinos Ninos, Paleo Faliro (GR); Tobias Mueller, Unterensingen (DE); Dimitrios Papadopoulos, Patras (GR)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 224 days.

(21) Appl. No.: 14/228,715

(22) Filed: Mar. 28, 2014

(65) Prior Publication Data

US 2014/0297928 A1 Oct. 2, 2014

(30) Foreign Application Priority Data

Mar. 28, 2013 (EP) .................................... 13161639

(51) Int. Cl.
*G06F 1/02* (2006.01)
*G06F 9/44* (2006.01)
(Continued)

(52) U.S. Cl.
CPC ........ *G06F 12/0246* (2013.01); *G06F 9/4403* (2013.01); *G06F 9/4418* (2013.01);
(Continued)

(58) Field of Classification Search
None
See application file for complete search history.

(56) References Cited

U.S. PATENT DOCUMENTS 6,823,435 B1 * 11/2004 Wisor ................... G06F 9/4403
711/103
2004/0250056 A1 * 12/2004 Chang ..................... G06F 8/443
713/1

(Continued)

OTHER PUBLICATIONS

Morgan, George and nonsensickle. "Executing programs stored in external SPI flash memory on an ARM processor" Stack Overflow. Published Dec. 28, 2013. <http://stackoverflow.com/questions/20205944/executingprograms-storedinexternalspiflashmemoryonanarmprocessor>.*

(Continued)

*Primary Examiner* — Charles Rones
*Assistant Examiner* — Hewy Li
(74) *Attorney, Agent, or Firm* — Saile Ackerman LLC; Stephen B. Ackerman

(57) ABSTRACT

A method and apparatus for executing an application program stored in an one-time-programmable, OTP, memory in a system on chip (SoC) is described. The SoC has RAM, a CPU and an OTP controller. The OTP memory stores an application program. The method includes, by the processor unit at power-up, instructing the OTP controller to copy the application program from the OTP memory to RAM, executing the application program from RAM, and setting the system on chip (SoC) in sleep mode. By the OTP controller after a wake-up, copying the application program from the OTP memory to the RAM and after the copying, waking up the CPU and transferring control back to the CPU. By the CPU after being woken up by the OTP controller, executing the application program from RAM.

14 Claims, 3 Drawing Sheets

(51) Int. Cl.
    *G06F 1/24*      (2006.01)
    *G11C 17/16*     (2006.01)
    *G06F 12/02*     (2006.01)
(52) U.S. Cl.
    CPC ........ *G06F 1/24* (2013.01); *G06F 2212/2142* (2013.01); *G11C 17/16* (2013.01)

(56) References Cited

U.S. PATENT DOCUMENTS

| | | | |
|---|---|---|---|
| 2007/0226477 A1 | 9/2007 | Haban et al. | |
| 2008/0148083 A1* | 6/2008 | Pesavento | G06F 1/3203 713/322 |
| 2008/0208376 A1* | 8/2008 | Jung | G11B 19/02 700/94 |

OTHER PUBLICATIONS

Gibbons, Alan, et al. "Low Power Methodology Manual." p. 208-211. (2007).*
European Search Report 13161639.3-1954 Mailed: Sep. 10, 2013, Dialog Semiconductor B.V.
"A 32-KB Standard CMOS Antifuse One-Time Programmable ROM Embedded in a 16-bit Microcontroller," by Hyouk-Kyu Cha et al., IEEE Journal of Solid-State Circuits, vol. 41, No. 9, Sep. 2006, pp. 2115-2024.
"Integrating High Density Antifuse OTP NVM for Code Storage", by Vivien Lin, White Paper, Jul. 1 2009, pp. 1-7, Retrieved from the Internet: http://www.kilopass.com/wp-content/uploads/2010/04/Antifuse-OTP-NVM-for-Code-storage.pdf.

* cited by examiner

US 9,606,913 B2

ELECTRONIC CIRCUIT FOR AND METHOD OF EXECUTING AN APPLICATION PROGRAM STORED IN A ONE-TIME-PROGRAMMABLE (OTP) MEMORY IN A SYSTEM ON CHIP (SOC)

TECHNICAL FIELD

The present disclosure relates to the field of executing an application program stored in a One-Time-Programmable (OTP) memory in a System on Chip (SoC).

BACKGROUND

The use of One-Time-Programmable (OTP) memories as Non-Volatile storage for code in ultra-low power deeply embedded systems is recently deployed. The main reason is the smaller size of the cells compared to embedded FLASH memories. So far, OTPs have been used for storing a secret key, system's configuration parameters, or even as bit flags for various operations within a System on Chip (SoC). Lately, new technologies have enabled the use of larger OTP cells (i.e. 64 Kbytes) for storing the firmware required for the SoC to operate. Such cells are also used in SoCs designed for ultra-low power applications. So, in general, such OTP memories may store data and/or instructions of (smaller) programs.

Thus, the use of OTPs as Non-Volatile memories to store programmer's code in SoCs may be a great feature for chip vendors since different ROM versions do not need to be generated for different customers. I.e., the user can program his own firmware/software in the OTP, and a CPU based SoC will just have to execute that program as if it would be from a normal ROM memory. However, when very low power dissipation is the goal of the final SoC, the direct access of the CPU on the OTP for fetching and executing code is a drawback. Due to the anti-fuse technology that OTP memories are typically made of, access power is an order of magnitude larger than the one of a normal 6-transistor cell based embedded RAM. This is getting more important when systems need to periodically change between deep sleep mode (i.e. turning off all possible power lines to avoid leakage) and active mode (when the system actual runs the application).

SUMMARY

A main disadvantage of OTPs is the very high power dissipation if constantly accessed, i.e. the CPU reads and executes code from it. This is a disadvantage especially in SoCs designed for ultra-low power applications.

The object of the present disclosure is to provide a solution to that problem.

To that effect, the present disclosure is a system on chip comprising an one-time-programmable, OTP, memory, a read only memory, ROM, a random access memory, RAM, a processor unit and an OTP controller, the processor unit being connected to the OTP controller, to the ROM, and to the RAM, the OTP controller being connected to the OTP memory and to the RAM, the ROM comprising instructions to be used by the processor unit after a power-up of the system on chip, and the OTP memory storing a set of instructions relating to an application program and an application length indicating a length of the application program, the system on chip being arranged such that:

The processor unit performs the following actions at power-up:

Copy the application length from the OTP memory to a length register in the OTP controller;
Instruct the OTP controller to copy the set of instructions relating to the application program from the OTP memory to the RAM while using the application length;
Execute the first set of instructions relating to the application program from the RAM;
Set the system on chip in sleep mode;

The OTP controller performs the following actions after a wake-up of the system on chip:
Copy the set of instructions relating to the application program from the OTP memory to the RAM while using application length;
After the copying, to wake up the CPU and transfer control back to the CPU;

the CPU after being woken up by the OTP controller:
Executes the set of instructions relating to the application program from the RAM.

The proposed disclosure describes a method to reduce power by mirroring the content of the OTP memory into an embedded RAM at power-up and wake-up of the electronic circuit, preferably at maximum possible speed.

After power-up, the CPU instructs the OTP controller to mirror the application program code from the OTP memory to RAM. After wake-up, the OTP processor, preferably equipped with a DMA engine, directly takes over the mirroring process from the CPU of the SoC and mirrors the application program code to RAM.

In cases where low power SoCs have a certain duty cycle of active/deep sleep time due to the application, mirroring the OTP contents every time the system wakes up instead of executing directly from the OTP makes a huge difference at the overall energy consumption. For example, if a CPU executes directly from the OTP then the number of accesses will be quite high, since a read operation will occur for the time the application is active. Trying to minimize the time that the OTP is active, a straight copy of the application code into the RAM is achieving this goal. The overall power dissipated by the mirroring to RAM plus the RAM code execution is proven to be lower than direct OTP code execution. The claimed solution, for instance, may reduce dynamic power in low-power SoCs using OTPs as Non-Volatile memory. That is especially important in systems with large duty cycles of active/sleep periods.

BRIEF DESCRIPTION OF THE DRAWINGS

The disclosure will be explained in detail with reference to some drawings that are only intended to show embodiments of the disclosure and not to limit the scope. The scope of the disclosure is defined in the annexed claims and by its technical equivalents. A person skilled in the art will understand that features, components, elements, etc. explicitly used to explain the disclosure can be substituted by technical equivalents unless otherwise stated.

The drawings show.

DESCRIPTION

In the explanation below like reference numbers and labels in different drawings are used to refer to the same components and elements.

Figure 1:
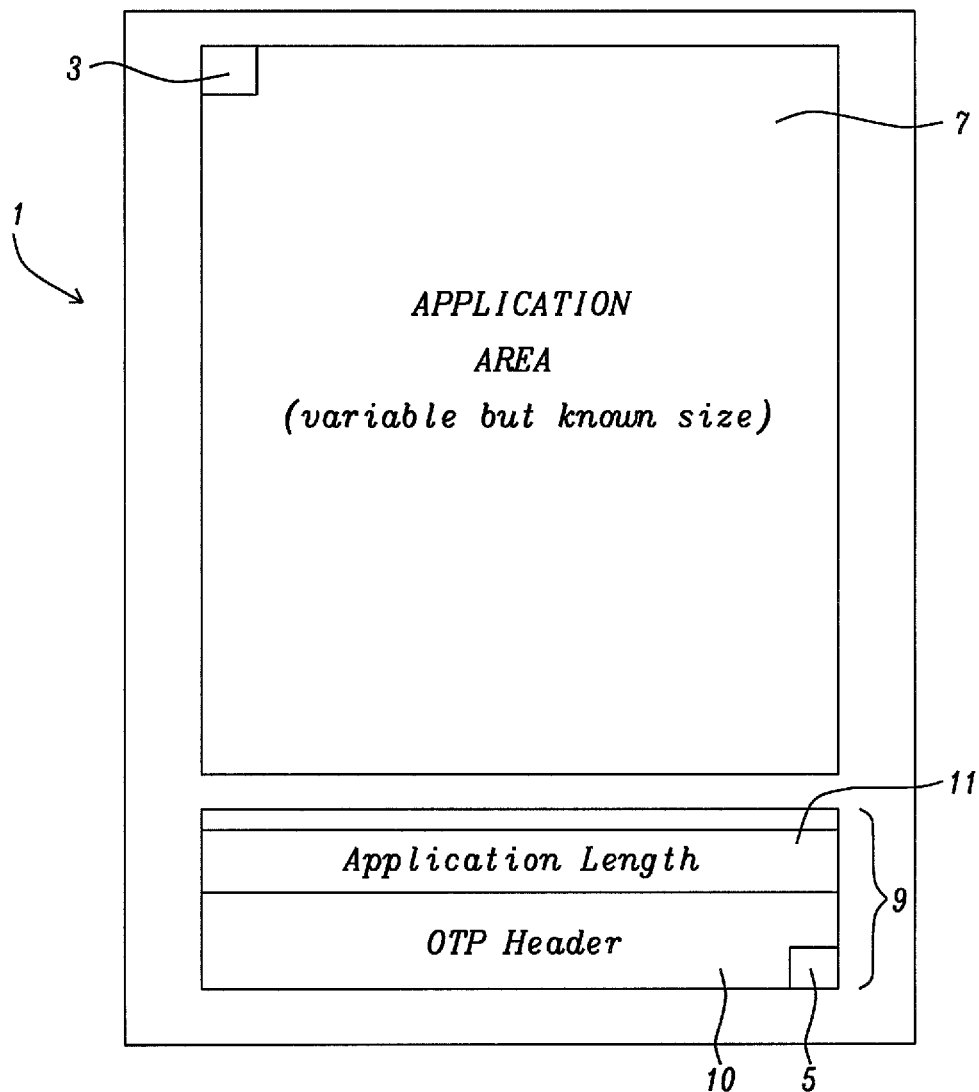
FIG. 1 shows an OTP memory arranged in accordance with the present disclosure.

FIG. 1 shows an OTP memory 1 in accordance with the disclosure, which contains data and instructions as stored by a user. The OTP memory 1 has a start address 3 and an end address 5. The OTP memory 1 contains two areas which are functionally separated from each other: an application area 7 and a OTP header area 9. Their location in OTP memory 1 is shown very schematically and is not important for the present disclosure. The OTP header area 9 can be located closer to the start address 3 than the application area 7.

The application area 7 is a memory area where a user is allowed to place his own, proprietary application program code, i.e. data and instructions relating to a specific application computer program. The OTP header area 9 stores an OTP header 10 which is a memory portion that is reserved. It has a specific layout, which comprises several memory registers where every memory register is assigned a specific functionality. One of these memory registers in the OTP header area 9 is an application length field 11, which contains an application length indicating the length of the application area, e.g. the number of application area words. Such "words" can have any desired length, for instance 8-bits, 16-bits, 32-bits, etc. Also, the length of the application area can be expressed in other terms than "words" as will be apparent to persons skilled in the art.

Figure 2:
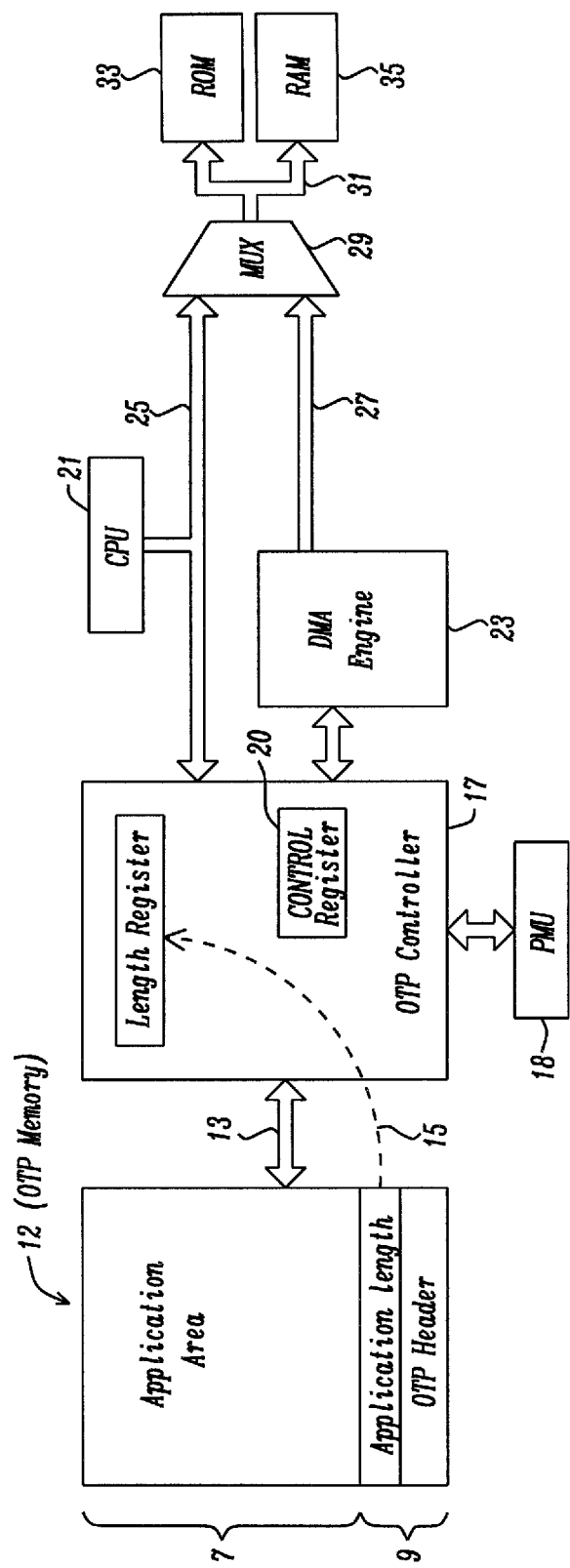
FIG. 2 shows an architecture of a SoC in accordance with the present disclosure.

FIG. 2 shows a mirroring architecture in an embodiment of the proposed disclosure. The architecture comprises a special circuit, hereafter addressed as an OTP controller 17 connected via a suitable connection to the OTP memory 1 and to an SoC internal bus 25.

Thus, the OTP controller 17 implements an interfacing between the OTP memory 1 and the SoC internal bus 25. The OTP controller 17 also comprises or connects to a Direct-Memory-Access (DMA) engine 23. Alternatively, the functionality of the OTP controller 17 and the Direct-Memory-Access engine 23 may be combined in a single unit.

A power management unit, PMU, 18 is provided within the SoC and connected to the OTP controller 17. Such a PMU 18 is a circuit taking care of waking up the SoC after an interrupt. Amongst others, it may turn on DC-DC converters, low drop-out (LDO) regulators, etc, after wake-up. Its possible function in the present disclosure will be explained later.

The architecture comprises a CPU 21 also connected to the SoC internal bus 25. Moreover, the SoC internal bus 25 is connected to a first input of a multiplexer 29. The multiplexer 29 has a second input which is connected to the DMA engine 23 via a suitable connection 27. The multiplexer 29 has an output which is connected to both an embedded read only memory (ROM) 33 and an embedded random access memory (RAM, which may be SRAM) 35 via a suitable connection 31. Thus, the DMA engine 23 can directly communicate to the embedded RAM 35 of the SoC. The OTP controller 17 incorporates a memory with a length register 19 which is arranged to store the length of the program residing in the OTP application area 7. Also, the OTP controller 17 comprises a CONTROL register 20. At power-up, the application length 11 is read by the CPU 21, which reads and executes ROM code while in power up, and stored into the length register 19 residing in the OTP controller 17, as indicated with arrow 15.

The length register 19 keeps the contents after the initial copy action to RAM 35 during power up. In cases where the system powers off/on to achieve even better dissipation, then this length register 19 should be a special retention register always powered on to keep its contents uncorrupted.

At power-up of the SoC, CPU 21 instructs OTP processor 17 to read the application program from OTP memory 1 and to write the data/instructions relating to this application program into RAM 35. The OTP controller 17 equipped with or connected to DMA engine 23 performs the mirroring process when the system wakes up when CPU 21 has been asleep, as will be further explained hereinafter.

Figure 3:
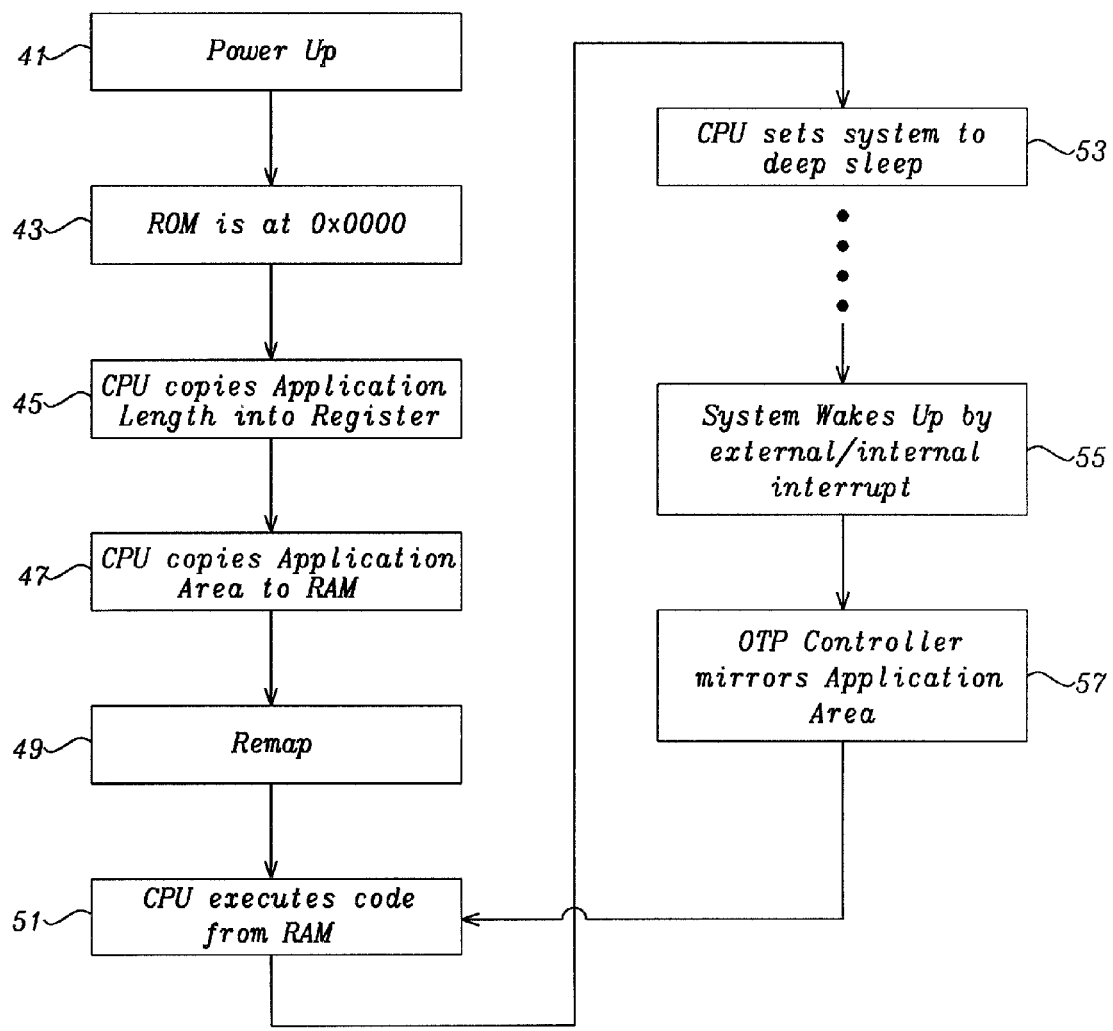
FIG. 3 shows a flow chart to explain the functionality of the present disclosure.

FIG. 3 shows a flow chart of an example of the functionality during power-up and wake-up of the present disclosure.

In action 41, the SoC is powered up, and its CPU 21 starts running from embedded ROM 33, e.g. from start address 0x0000, as indicated in action 43.

In action 45, as instructed by an instruction read from ROM 33, CPU 21 reads the application length 11 from OTP memory 1 and stores a copy in length register 19. Moreover, CPU 21 programs CONTROL register 20 to store control data, which may be as short as a single control bit.

In the next action 47, the CPU's 21 programming of the control data in CONTROL register 20 functions as a trigger for OTP controller 17 to have its DMA engine 23 copy the content of application area 7 into the embedded RAM 35, while using the application length as stored in length register 19 to read the correct number of words from OTP memory 1. In a preferred embodiment, the length register 19 is a special retention register which keeps its memory content even when the CPU 21 goes asleep.

Programming the CONTROL register 20 with suitable control data is just one way in which CPU 21 can instruct the OTP controller 17 to mirror the application program to RAM 35, as will be evident to persons skilled in the art.

As soon as storing the copy in RAM 35 is finished, CPU 21 remaps the start address 0x0000 to point to RAM 35, rather than to initial ROM 33, cf. action 49, for the next time that CPU 21 will wake up.

The CPU 21 is now ready to start executing code from the RAM 35, as indicated in action 51, while the OTP memory 1 can be powered off totally or kept in idle mode.

After having run the application program from RAM 35, the CPU 21 may set the system to deep sleep mode, as indicated in action 53. During the (deep) sleep mode, the OTP controller 17 takes over control from CPU 21.

After a while, as shown in action 55, the SoC may be woken up by an internal or external interrupt. The interrupt causes PMU 18 to program CONTROL register 20 such as to store the control data in CONTROL register 20. Once stored in this CONTROL register 20, the control data triggers, in action 57, the OTP controller 17 with help of its DMA engine 23 and while using the content of the length register 19 to mirror the content of application area 7 to RAM 35.

Again, programming the CONTROL register 20 with suitable control data by PMU 18 is just one way in which the OTP controller 17 may be triggered to mirror the application program to RAM 35, as will be evident to persons skilled in the art.

After the mirroring action, CPU 21 is woken up by OTP controller 17, and OTP controller 17 transfers control to CPU 21, which then jumps to—action 51 and executes code from the application program as stored in RAM 35. It is observed that CPU 21 will do so since, in action 49, CPU 21 had remapped the ROM start address 0x0000 to point to RAM 35, rather than to initial ROM 33.

In comparison to prior art arrangements where a controller in the SoC fetches instructions from the OTP memory 1 and then executes these instructions directly, power is saved by minimizing the time that the OTP memory 1 is active. I.e., a straight copy of the application code is written into RAM 35 from which the program code is executed. Thus, the number of accesses to the OTP memory 1 by CPU 21 is reduced to a minimum. The overall power dissipated by the mirroring to RAM plus the RAM code execution is proven to be lower than in place OTP code execution.

Reduction in active power can especially be expected in the following cases:

1. In cases where the size of the OTP memory 1 is not too big such that the mirroring power is only a small percentage of the overall active power. Nowadays, OTP memories are available in the market up to 128 Kbytes of size. The mirroring power is a factor in access current consumption. However, with these sizes a power reduction will be achieved.
2. In cases that the duty cycle is so long, that the OTP mirroring power does not dominate the average dissipation over time. The minimum duty cycle of an application program stored in OTP memory 1 with respect to the active time of a program run by CPU 21 can be calculated to be the absolute point below which mirroring is not contributing to power reduction. For instance, for a Bluetooth Low Energy case study, and a 32 Kbytes application program in OTP memory 1, this point is estimated to be at about 20 msec. If the duty cycle of the application program is above this time period, then the dissipated power is reduced by using the proposed disclosure. This applies to current Bluetooth LE (LE=low energy) applications which have a duty cycle of about 1 sec. Of course, these figures apply to date, and are subject to changes when OTP technology is developed further over time. It is to be understood that the disclosure is limited by the annexed claims and its technical equivalents only. In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

What is claimed is:

1. A system on chip (SoC) comprising a one-time-programmable, (OTP) memory, a read only memory (ROM), a random access memory, (RAM), a processor unit and an OTP controller, said processor unit being connected to said OTP controller, to said ROM, and to said RAM said OTP controller being connected to said OTP memory and to said RAM, said ROM comprising instructions to be used by said processor unit after a power-up of said system on chip (SoC), and said OTP memory storing a set of instructions relating to an application program and an application length indicating a length of said application program, the system on chip (SoC) being arranged such that:

said processor unit is configured to perform the following actions at power-up:

copy said application length from said OTP memory to a length register in said OTP controller, the length register being a retention register which keeps its memory content even in case the processor unit enters a sleep mode;

instruct said OTP controller to copy said set of instructions relating to said application program from said OTP memory to said RAM using said application length;

execute said set of instructions relating to said application program from said RAM;

set said system on chip (SoC) in sleep mode;

said OTP controller is configured to perform the following actions in response to receiving an interrupt to wake-up the system on chip (SoC) from said sleep mode:

copy said set of instructions relating to said application program from said OTP memory to said RAM while using said application length as stored in said length register;

in response to said copying of said set of instructions, wake up said processor unit and transfer control back to said processor unit;

said processor unit in response to being woken up by said OTP controller:

execute said set of instructions relating to said application program from said RAM.

2. The system according to claim 1, wherein said OTP controller comprises or is connected to a direct memory access (DMA) engine which performs said copying of said set of instructions relating to said application program from said OTP memory to said RAM.

3. The system as claimed in claim 1, wherein said length register is always powered on in order to keep the contents of said length register uncorrupted.

4. The system according to claim 1, wherein the OTP controller comprises a control register, and the processor unit is arranged to, after power-up, program the control register to store a control word which, once stored, triggers said OTP controller to copy said set of instructions relating to said application program from said OTP memory to said RAM.

5. The system according to claim 4, wherein the system comprises a power management unit which is arranged to, after wake-up, program the control register to store said control word which, once stored, triggers said OTP controller to copy said set of instructions relating to said application program from said OTP memory to said RAM.

6. The system according to claim 1, wherein said OTP memory is either powered off totally or kept in idle mode when said processor unit is executing said set of instructions relating to said application program from said RAM.

7. The system according to claim 1, wherein said application program is a Bluetooth application.

8. A method of executing an application program stored in a one-time-programmable (OTP) memory in a system on chip (SoC), which system on chip (SoC) also comprises a read only memory (ROM), a random access memory (RAM), a processor unit and an OTP controller, said processor unit being connected to said OTP controller, to said ROM, and to said RAM, said OTP controller being connected to said OTP memory and to said RAM, said ROM comprising instructions to be used by said processor unit after a power-up of said system on chip (SoC), and said OTP memory storing a set of instructions relating to an application program and an application length indicating a length of said application program, the method comprising:

by said processor unit at power-up:

copying said application length from said OTP memory to a length register in said OTP controller, the length register being a retention register which keeps its memory content even in case the processor unit enters a sleep mode;

instructing said OTP controller to copy said set of instructions relating to said application program from said OTP memory to said RAM while using said application length;

executing said set of instructions relating to said application program from said RAM;

setting said system on chip (SoC) in sleep mode;

by said OTP controller in response to receiving an interrupt to wake-up the system on chip (SoC) from said sleep mode:

copying said set of instructions relating to said application program from said OTP memory to said RAM using said application length as stored in said length register;

in response to said copying of said set of instructions, waking up said processor unit and transferring control back to said processor unit;

by said processor unit in response to being woken up by said OTP controller:

executing said set of instructions relating to said application program from said RAM.

9. The method according to claim 8, wherein said copying of said set of instructions relating to said application program from said OTP memory to said RAM is performed by a direct memory access (DMA) engine which is either part of or connected to said OTP controller.

10. The method as claimed in claim 8, comprising keeping said length register always powered on in order to keep the contents of said length register uncorrupted.

11. The method according to claim 8, wherein the method comprises, by said processor unit, after power up, programming a control register in said OTP controller to store a control word which, once stored, triggers said OTP controller to copy said set of instructions relating to said application program from said OTP memory to said RAM.

12. The method according to claim 11, wherein the method comprises by a power management unit, after wake-up, programming the control register to store said control word which, once stored, triggers said OTP controller to copy said set of instructions relating to said application program from said OTP memory to said RAM.

13. The method according to claim 8, comprising keeping said OTP memory either powered off totally or in idle mode when said processor unit is executing said first set of instructions relating to said application program from said RAM.

14. The method according to claim 8, wherein said application program is a Bluetooth application.

* * * * *